US009291652B2

(12) United States Patent
Cordaro

(10) Patent No.: US 9,291,652 B2
(45) Date of Patent: Mar. 22, 2016

(54) NON-INTRUSIVE PASSIVE INTERMODULATION TESTING

(75) Inventor: Nicholas James Cordaro, Roselle Park, NJ (US)

(73) Assignee: Cellco Partnership, Basking Ridge, NJ (US)

( * ) Notice: Subject to any disclaimer, the term of this patent is extended or adjusted under 35 U.S.C. 154(b) by 887 days.

(21) Appl. No.: 13/588,224

(22) Filed: Aug. 17, 2012

(65) Prior Publication Data

US 2014/0049267 A1 Feb. 20, 2014

(51) Int. Cl.
*G01R 23/20* (2006.01)

(52) U.S. Cl.
CPC .................................. *G01R 23/20* (2013.01)

(58) Field of Classification Search
CPC .. G01R 27/02; G01R 27/2605; G01R 31/343; H01L 27/0248
USPC ........... 324/76.11, 76.39, 624, 672–688, 600, 324/548, 658, 661, 427, 382, 519, 500, 324/750.17, 754.28
See application file for complete search history.

(56) References Cited

U.S. PATENT DOCUMENTS

| 6,125,109 | A * | 9/2000 | Fuerter ......................... 370/315 |
| 9,077,577 | B1 * | 7/2015 | Ashrafi et al. |
| 2002/0094785 | A1 * | 7/2002 | Deats ........................... 455/67.3 |
| 2010/0295533 | A1 * | 11/2010 | Kuga et al. ................. 324/76.39 |
| 2011/0251807 | A1 * | 10/2011 | Rada et al. ....................... 702/61 |
| 2013/0177106 | A1 * | 7/2013 | Levesque et al. ............. 375/297 |
| 2015/0002165 | A1 * | 1/2015 | Juntunen et al. .............. 324/537 |

* cited by examiner

*Primary Examiner* — Melissa Koval
*Assistant Examiner* — Trung Nguyen

(57) ABSTRACT

A passive intermodulation test device includes a first signal generator that generates a first signal and a second signal generator that generates a second signal. A combiner combines the first signal and the second signal to generate a combined signal. A duplexer receives a test signal based, at least in part, on the combined signal and filters the first signal and the second signal from the test signal to generate an intermodulation signal. A variable low-noise amplifier amplifies the intermodulation signal in accordance with a variable gain based at least in part on a selected power level. A receiver, upon receipt of the intermodulation signal, measures intermodulation generated by a device under test.

21 Claims, 6 Drawing Sheets

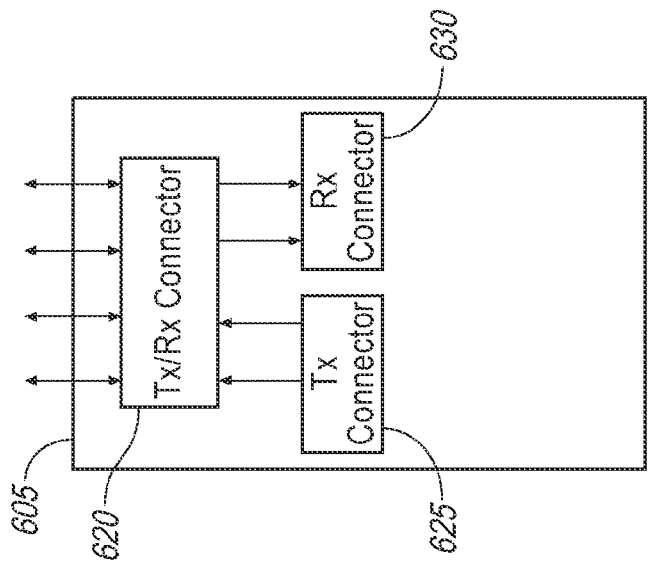
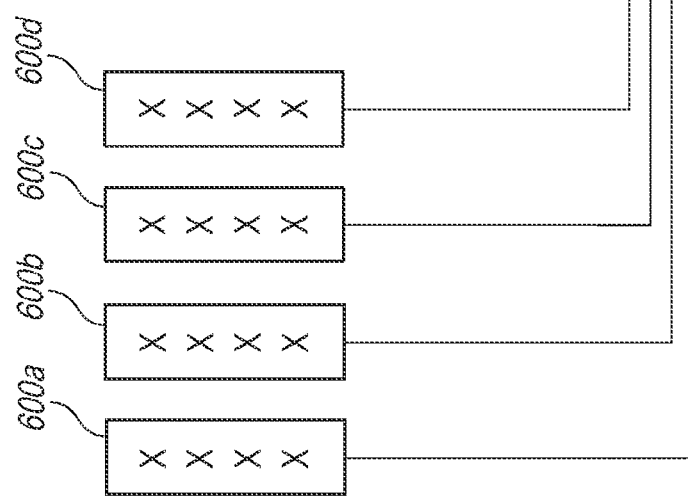

NON-INTRUSIVE PASSIVE INTERMODULATION TESTING

BACKGROUND

Passive intermodulation occasionally occurs in telecommunications equipment when two or more primary signals combine to form secondary signals at non-harmonic frequencies. The secondary signals created can increase noise and interference, especially on adjacent frequency channels relative to the frequencies of the primary signals. Testing for passive intermodulation is typically intrusive, meaning that the signal path of the device under test must be broken, and is limited to devices that facilitate duplexed communication because intermodulation testing is performed on a transmit/receive test point as opposed to other, non-duplexed, points along the test path. Intrusive testing for passive intermodulation, therefore, results in increased down time for the device under test and may not identify which component is creating the intermodulation. In other words, if the intermodulation is caused by a component along the transmit/receive test point, current intermodulation testing techniques may be sufficient. If the intermodulation is caused by another component that does not transmit signals via the transmit/receive test point, such as components within a base station, current devices and methods of intermodulation testing may be unable to identify those base station components as the cause of intermodulation.

BRIEF DESCRIPTION OF THE DRAWINGS

FIG. 6A illustrates exemplary test points for an intrusive test.

FIG. 6B illustrates exemplary test points for a non-intrusive test.

DETAILED DESCRIPTION

An exemplary passive intermodulation test device includes a first signal generator that generates a first signal and a second signal generator that generates a second signal. A combiner combines the first signal and the second signal to generate a combined signal. A duplexer receives a test signal based at least in part on the combined signal and filters the first signal and the second signal from the test signal to generate an intermodulation signal. A variable low-noise amplifier amplifies the intermodulation signal in accordance with a variable gain based at least in part on a selected power level. A receiver, upon receipt of the intermodulation signal, measures intermodulation generated by a device under test. The passive intermodulation test device as disclosed herein may be used by a technician to intrusively or non-intrusively measure intermodulation produced by various types of devices.

Figure 1:
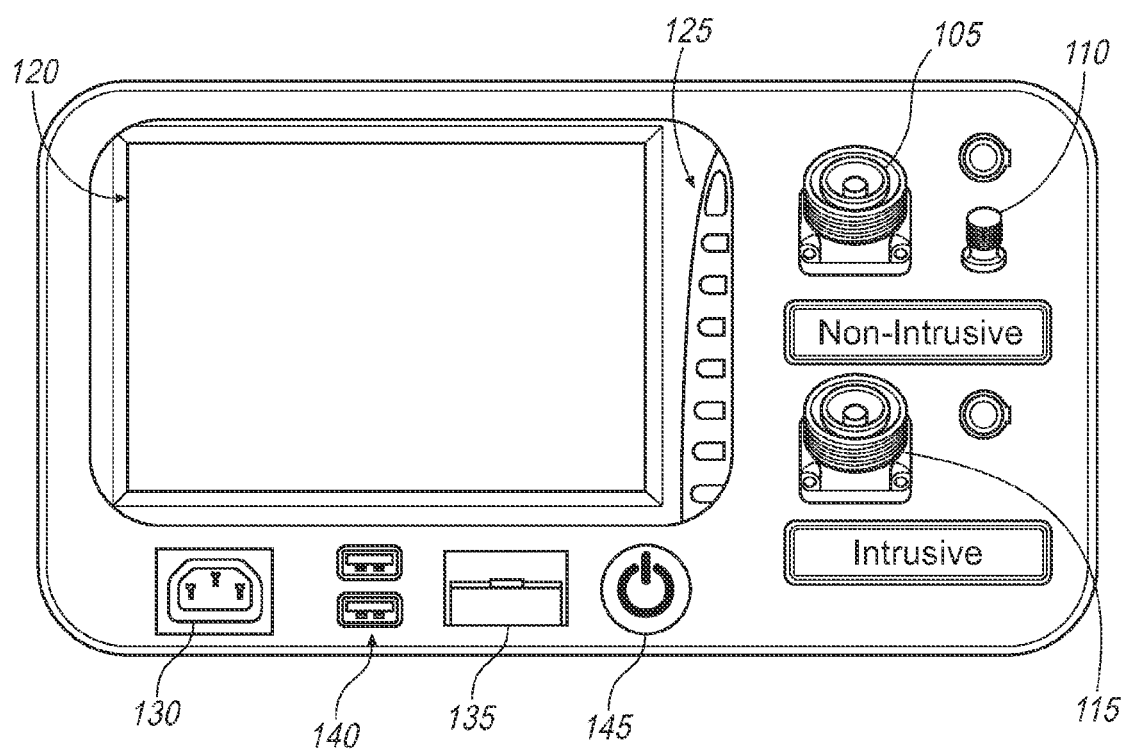
FIG. 1 illustrates an exemplary passive intermodulation test device configured to conduct both intrusive and non-intrusive intermodulation tests.

FIG. 1 illustrates an exemplary passive intermodulation (PIM) test device 100 configured to conduct either intrusive or non-intrusive passive intermodulation tests. The PIM test device 100 may take many different forms and include multiple and/or alternate components and facilities. While an exemplary PIM test device 100 is shown in FIG. 1, the exemplary components illustrated in the figures are not intended to be limiting. Indeed, additional or alternative components and/or implementations may be used.

The PIM test device 100 may be configured to measure passive intermodulation, which may occur for any number of reasons after two primary signals are inadvertently mixed to generate secondary signals. Some causes of passive intermodulation include contaminated surfaces, loose mechanical junctions, or inconsistent metal-to-metal contacts between components. Manufacturing defects or normal wear can also cause passive intermodulation.

Intermodulation occurs in a relatively predictable way. The frequencies of the primary signals may be used to detect the secondary signals caused by intermodulation. Testing for intermodulation may therefore involve identifying various intermodulation products, such as a third order product, a fifth order product, and a seventh order product. In the following equations, "$f_1$" may represent the frequency of one of the primary signals while "$f_2$" may represent the frequency of another one of the primary signals. The third order product may be defined as follows:

$$f_1 \pm 2f_2 \text{ or } 2f_1 \pm f_2. \tag{1}$$

The fifth order product may be defined as:

$$2f_1 \pm 3f_2 \text{ or } 3f_1 \pm 2f_2. \tag{2}$$

The seventh order product may be defined as:

$$3f_1 \pm 4f_2 \text{ or } 4f_1 \pm 3f_2. \tag{3}$$

Equations (1)-(3) assume only two signals form each secondary signal. Secondary signals formed from more than two signals may be defined by other equations.

The PIM test device 100 illustrated in FIG. 1 may be used by a technician to intrusively or non-intrusively test for passive intermodulation. An intrusive test for passive intermodulation may be useful when the device being tested is configured for duplexed communication. Such intrusive testing of devices that are not configured for duplexed communication is impossible. A non-intrusive PIM test may however allow the technician to test for passive intermodulation without breaking a connection or interrupting service, and thus, may be beneficial when testing devices that are not configured for duplexed communication.

In addition to testing for intermodulation, the PIM test device 100 may be further configured to test for return loss, which may be defined as a loss of signal power resulting from a reflection caused by a change in transmission medium. The PIM test device 100 may be configured to test for return loss prior to testing for intermodulation to, e.g., eliminate return loss as a potential cause of interference. If return loss is eliminated as a potential issue, the PIM test device 100 may be configured to conduct an intrusive or non-intrusive intermodulation test, as discussed below.

As illustrated in FIG. 1, the PIM test device 100 includes a transmit port 105, a receive port 110, a transmit/receive port 115, a display device 120, an input device 125, a power interface 130, and a card slot 135. The PIM test device 100 may be configured to interface with a device under test (see FIG. 2) to determine whether the device under test is contributing intermodulation.

The transmit port 105 and the receive port 110 may each include any device configured to interface with the device under test 200. In one exemplary approach, the transmit port 105 may include, for instance, a Deutches Institut fur Normung (DIN) connector or any other device that facilitates communication of the test signal to the device under test 200. The transmit port 105, therefore, may be configured to receive the combined signal from the (internal) combiner for transmission to the device under test. The receive port 110 may include, for instance, a sub-miniature version A (SMA) connector. The receive port 110 may alternatively include other types of connectors configured to receive signals from the device under test. The separate transmit port 105 and receive port 110 may be used during non-intrusive intermodulation tests, as discussed in greater detail below.

The transmit/receive port 115 may be configured to interface with a device under test that uses duplexed communication, such as an antenna. In one possible approach, the transmit/receive port 115 may include a DIN connector. In operation, the transmit/receive port 115 may be configured to both receive signals from and transmit signals to the device under test. The transmit/receive port 115, therefore, may be used during intrusive intermodulation tests.

The display device 120 may be configured to present visual representations of received signals to a user, such as a technician testing for intermodulation. The display device 120 may present graphs representing the frequency, amplitude, power, or any other signal characteristic to the user selectable, e.g., via the input device 125. Moreover, the display device 120 may be used to prompt the user to input information into the PIM test device 100.

The input device 125 may be configured to allow a user to provide information to the PIM test device 100. As illustrated, the input device 125 includes a plurality of buttons. Each button may correspond to a particular command or input. In some exemplary approaches, the command associated with each button may change depending on the information displayed via the display device 120. The PIM test device 100 may also, or instead, receive inputs from peripheral devices, such as a keyboard, mouse, and the like. The input device 125 may be an external device connected to the PIM test device 100 via an input port 140, such as a universal serial bus (USB) port.

The power interface 130 may be configured to receive a power adapter and provide electric energy to the PIM test device 100. When a power adapter is plugged into both the power interface 130 and, e.g., a wall outlet, the PIM test device 100 may turn on. Alternatively, as illustrated, the PIM test device 100 may further include a power button 145 that, when pressed, may cause the PIM test device 100 to power on.

The card slot 135 may be configured to receive one or more removable memory devices (not shown), such as a secure digital (SD) card or other form of non-volatile media. The card slot 135 may be configured to receive such removable memory devices. Although not illustrated, the card slot 135 may include connectors to allow a processor (not shown) to interface with the information stored on the removable memory device.

Figure 2:
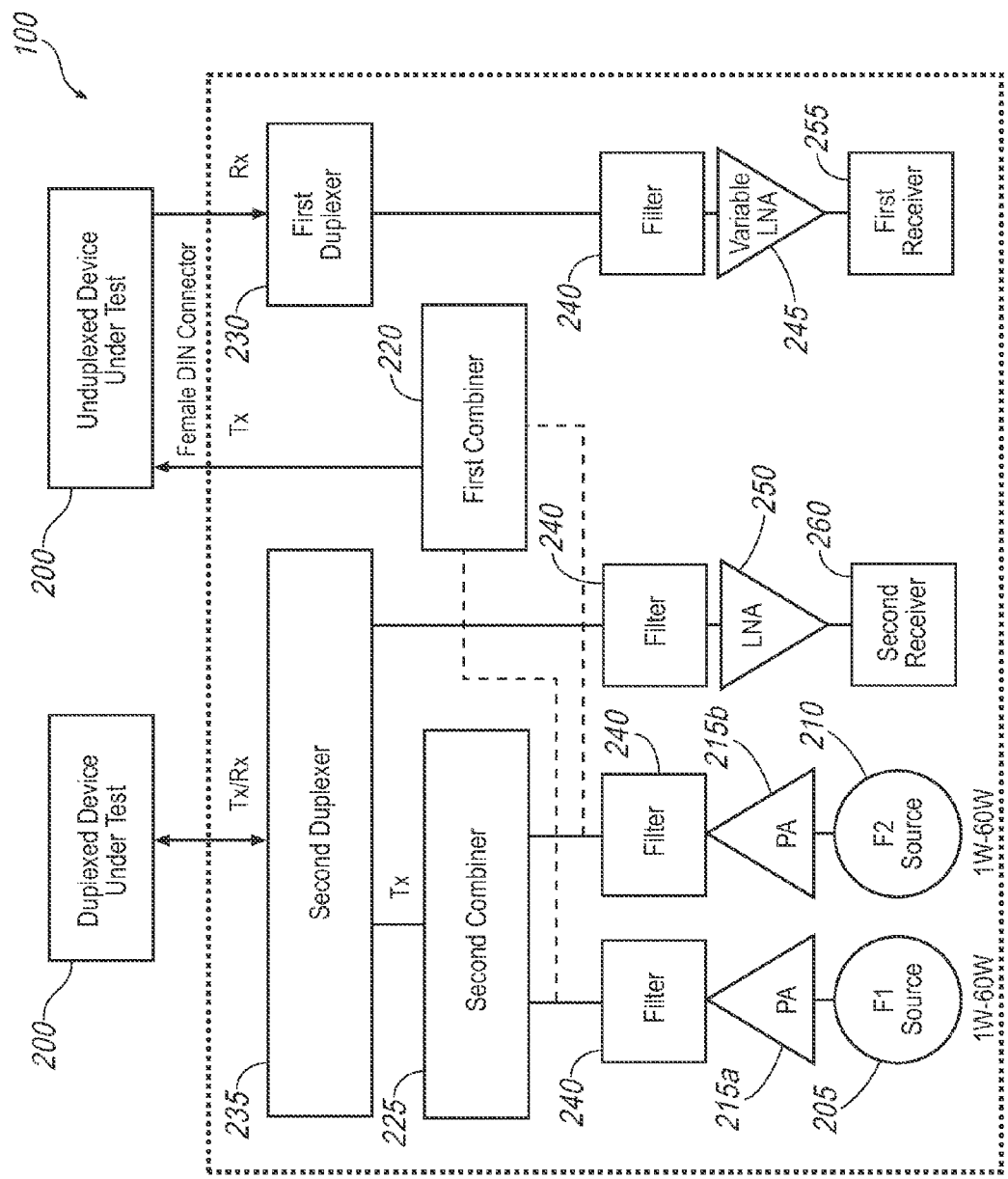
FIG. 2 is a block diagram of exemplary components of the passive intermodulation test device of FIG. 1.

FIG. 2 illustrates exemplary components of one possible PIM test device 100 in communication with a device under test 200. FIG. 2 illustrates how duplexed and unduplexed devices may connect to the PIM test device 100. While FIG. 2 shows two devices under test 200—one for duplexed communication and one for unduplexed communication—connected to the PIM test device 100, only one device may typically be tested at a time.

The device under test 200 may include any device configured to facilitate communication, either duplexed or un-duplexed, between at least two other devices. In one possible approach, the device under test 200 may include any device configured to receive, transmit, or otherwise facilitate electronic communication. The device under test 200 may include an antenna, a base station, one or more base station components, a filter, a cable, a connector, etc. The device under test 200, as mentioned above, may be tested for intermodulation. During a test for intermodulation, the device under test 200 may output a test signal, which as discussed in greater detail below, may indicate whether intermodulation is present. The test signal may further indicate whether the third, fifth, and/or seventh order product of the intermodulation is present. In many of these types of base station components, the transmit path is separate from the receive path prior to any filtering performed, making intrusive passive intermodulation testing unreliable.

As illustrated in FIG. 2, the PIM test device 100 includes a first signal generator 205, a second signal generator 210, power amplifiers 215, a first combiner 220, a second combiner 225, a first duplexer 230, a second duplexer 235, noise filters 240, a variable low-noise amplifier 245, a low-noise amplifier 250, a first receiver 255, and a second receiver 260. As discussed in greater detail below, some of these components are used during intrusive intermodulation testing while others are used during non-intrusive intermodulation testing. Further, some components are used during all types of intermodulation testing, whether intrusive or non-intrusive. Moreover, some components may be selected based upon characteristics of the device under test 200. For instance, the device under test 200 may be part of a telecommunications network operating in the 700 MHz band, the 800 MHz band, the 1900 MHz band, etc., and the components of the PIM test device 100 may be selected to conduct intermodulation measurements in these or other frequency bands, depending on the device tested.

The first signal generator 205 and second signal generator 210 may each include any device configured to generate primary signals, such as a first signal and a second signal, respectively. In one exemplary implementation, the first and second signal generators 205 and 210 may be configured to generate any signal having a particular frequency. The frequency of the first signal may be referred to as a first frequency and the frequency of the second signal may be referred to as a second frequency. The first and second signal generators 205 and 210 may be further configured to output their respective signals. In one possible approach, the first and second frequencies are based in part on a user selection, e.g., via the input device 125. That is, the user may be prompted via the display device 120 to select one or both frequencies, and the first and second signal generators 205 and 210 may be configured to generate signals with the selected frequencies in response to the selections. If, for example, the user selects the first frequency for the first signal to be generated by the first signal generator 205, the second signal generator 210 may be configured to automatically select the second frequency based on the user's selection of the first frequency. In this example approach, the second frequency may be automatically selected based on a predetermined frequency difference from the first frequency selected by the user.

Each power amplifier 215A and 215B, collectively referred to as 215, may include any device configured to amplify the power of any received signals to a predetermined or selected level. For instance, one power amplifier 215A may be configured to receive the first signal from the first signal generator 205 and amplify the power level of the first signal to a first power level. Likewise, another power amplifier 215B may be configured to receive the second signal from the second signal generator 210 and amplify the power level of the second signal to a second power level. The power amplifiers 215 may be independent of each other and thus the amplification may or may not be the same.

The first combiner 220 may include any device configured to combine two primary signals, such as the first signal and the second signal, and output a combined signal that includes components of both the first and second signals. In one embodiment, the first combiner 220 is configured to receive the first signal from the first signal generator 205 and the second signal from the second signal generator 210. More specifically, the first combiner 220 may be configured to receive, directly or indirectly, the amplified first signal and amplified second signal from the power amplifiers 215. The combined signal, therefore, may represent two signals having different frequencies and, in some instances, different power levels. Alternatively, the combined signal may equally distribute the power across the two frequencies represented by the first signal and the second signal. The first combiner 220 may be used during non-intrusive intermodulation testing.

The second combiner 225 may be similar to the first combiner 220 except the second combiner 225 may be used during intrusive intermodulation testing. That is, the second combiner 225 may be configured to generate the combined signal from the first signal and second signal generated by the first and second signal generators 205 and 210, respectively. However, instead of providing the combined signal directly to the device under test 200, the second combiner 225 may be configured to output the combined signal to the device under test 200 through the second duplexer 235.

The first duplexer 230 may include any device configured to receive and filter the test signal received from the device under test 200. In one implementation, the first duplexer 230 may be configured to filter the first signal and the second signal from the test signal so that only frequencies that represent intermodulation remain. The output of the first duplexer 230 may be referred to as an intermodulation signal. The intermodulation signal may include frequencies of the third order product, the fifth order product, the seventh order product, and the like.

The second duplexer 235 may be configured to transmit the combined signal from the second combiner 225 to the device under test 200 via the transmit/receive port 115 during, e.g., intrusive intermodulation testing. Like the first duplexer 230, the second duplexer 235 may be configured to isolate transmitted signals, such as the combined signal, from received signals, such as the test signal. Otherwise, the second duplexer 235 may operate in a similar fashion as the first duplexer 230 described above to output the intermodulation signal during the intrusive intermodulation test.

As shown, multiple noise filters 240 may be used throughout the PIM test device 100. Each noise filter 240 may be configured to filter noise from a received signal. The filter characteristics (e.g., bandwidth, range) filtered by the various noise filters 240 may be the same or may be different among the noise filters 240. Each noise filter 240 may include a band-pass filter, a high pass filter, a low pass filter, etc. One noise filter 240 may be configured to receive the intermodulation signal from the first duplexer 230 and filter at least some noise from the intermodulation signal. That noise filter 240 may be further configured to transmit the filtered intermodulation signal to the variable low-noise amplifier 245. Additional noise filters 240 may reduce noise in other signals such as the first signal and second signal from the power amplifiers 215 or the intermodulation signal from the second duplexer 235.

The variable low-noise amplifier 245 may include any device in communication with the first duplexer 230 and configured to amplify the intermodulation signal in accordance with a variable gain. In one exemplary approach, the variable low-noise amplifier 245 may receive the intermodulation signal directly from the first duplexer 230. In another possible approach, as illustrated in FIG. 1, the variable low-noise amplifier 245 may be configured to receive the intermodulation signal from the noise filter 240 connected with the first duplexer 230. To amplify the intermodulation signal in accordance with the variable gain, the variable low-noise amplifier 245 may implement multiple stages. A first stage may apply a particular gain that boosts the intermodulation signal to a particular power level. A second stage may follow the first stage and apply an additional gain to the already-boosted intermodulation signal. The variable low-noise amplifier 245 may include any number of stages. The gains supplied by one or more of the stages of the variable low-noise amplifier 245 may be selected based on requirements of the first receiver 255. That is, the power level provided at the output of each stage of the variable low-noise amplifier 245, and thus the gain of that stage, may be a predetermined power level, a power level selected by the user as discussed above, or a minimum power requirement of the first receiver 255, such as a sensitivity of the first receiver 255, discussed in greater detail below.

The low-noise amplifier 250 may include any device configured to amplify signals received from, e.g., the second duplexer 235. The low-noise amplifier 250 may be similar to the variable low-noise amplifier 245 except that the low-noise amplifier 250 may apply an overall predetermined gain to the signals received through one or more stages, each having a fixed gain. As discussed above, the variable low-noise amplifier 245 is configured to apply different gains based on the sensitivity of the second receiver 260.

The first receiver 255 and second receiver 260 may each include any device configured to measure intermodulation generated by the device under test 200. The first receiver 255 may be configured to measure intermodulation based at least in part on the intermodulation signal received from, e.g., the variable low-noise amplifier 245 during a non-intrusive intermodulation test. The first receiver 255 may have an associated sensitivity, which may define a minimum power level required for the receiver to measure intermodulation from the intermodulation signal. The first receiver 255 may communicate the associated sensitivity to the variable low-noise amplifier 245 so that the gain of one or more of the stages of the variable low-noise amplifier 245 may be automatically selected. Alternatively, the gain of one or more of the stages may be manually selected by a user, e.g., via the input device 125. In another embodiment, the gain of some of the stages of the variable low-noise amplifier 245 may be automatically selected, while the gain of others of the stages may be manually selected. The second receiver 260 may be configured to receive the intermodulation signal from the low-noise amplifier 250 during an intrusive intermodulation test. The first and second receivers 255 and 260 may each output signals to the display device 120 (see FIG. 1) so that a visual representation of the measured intermodulation can be presented to a technician or other user.

While two receivers 255 and 260 are illustrated in FIG. 2, the PIM test device 100 may in one exemplary approach use only one receiver (while the remaining circuitry remains more or less the same). In this alternative example approach, the low-noise amplifier 250 may output the amplified intermodulation signal to the same receiver as the variable low-noise amplifier 245.

In general, computing systems and/or devices, such as the PIM test device 100 of FIGS. 1 and 2, may employ any of a number of computer operating systems. Computing devices generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

A computer-readable medium (also referred to as a processor-readable medium) includes any non-transitory (e.g., tangible) medium that participates in providing data (e.g., instructions) that may be read by a computer (e.g., by a processor of a computer). Such a medium may take many forms, including, but not limited to, non-volatile media and volatile media. Non-volatile media may include, for example, optical or magnetic disks and other persistent memory. Volatile media may include, for example, dynamic random access memory (DRAM), which typically constitutes a main memory. Such instructions may be transmitted by one or more transmission media, including coaxial cables, copper wire and fiber optics, including the wires that comprise a system bus coupled to a processor of a computer. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, or any other medium from which a computer can read.

Databases, data repositories or other data stores used by the PIM test device 100 may include various kinds of mechanisms for storing, accessing, and retrieving various kinds of data, including a hierarchical database, a set of files in a file system, an application database in a proprietary format, a relational database management system (RDBMS), etc. Each such data store is generally included within a computing device employing a computer operating system such as one of those mentioned above, and are accessed via a network in any one or more of a variety of manners. A file system may be accessible from a computer operating system, and may include files stored in various formats. An RDBMS generally employs the Structured Query Language (SQL) in addition to a language for creating, storing, editing, and executing stored procedures, such as the PL/SQL language mentioned above.

In some examples, system elements may be implemented as computer-readable instructions (e.g., software) on one or more computing devices (e.g., servers, personal computers, etc.), stored on computer readable media associated therewith (e.g., disks, memories, etc.). A computer program product may comprise such instructions stored on computer readable media for carrying out the functions described herein.

Figure 3:
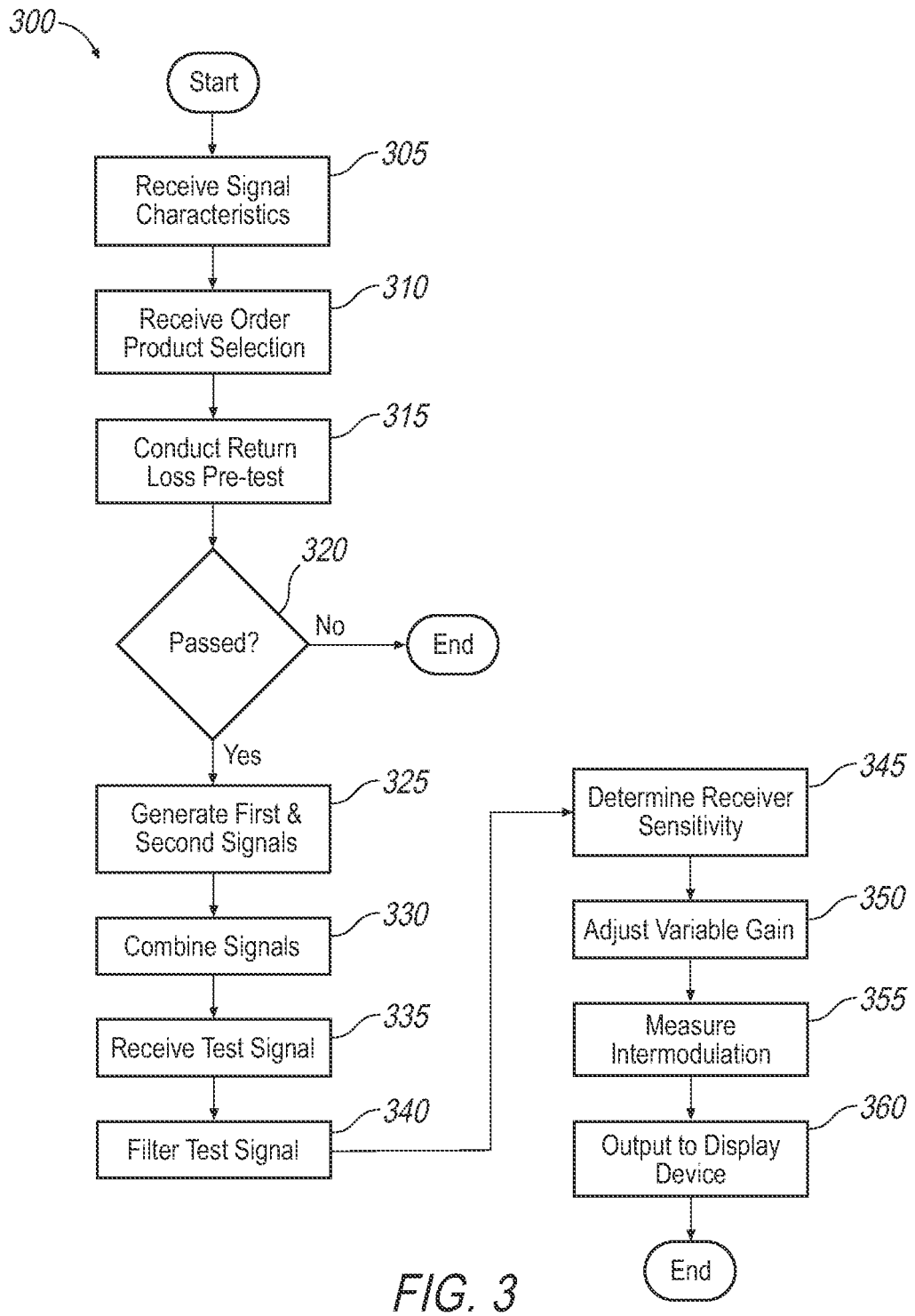
FIG. 3 is a flowchart of an exemplary process that may be implemented by the passive intermodulation test device to conduct a non-intrusive intermodulation test.

FIG. 3 illustrates an exemplary process 300 for non-intrusively measuring intermodulation generated by the device under test 200. The process 300 may be implemented by, e.g., any combination of the various components of the PIM test device 100 previously discussed.

Once physically connected to the device under test 200, at block 305, the PIM test device 100 may receive signal characteristics for the signals to be used in the non-intrusive test. In one exemplary approach, the PIM test device 100, using the display device 120, may prompt the user to provide any one or more of the first frequency and the first power level for the first signal and the second frequency and second power level for the second signal. The PIM test device 100 may receive the signal characteristics from the user via the input device 125. In some example approaches, the PIM test device 100 may use one or more received signal characteristics to automatically determine one or more remaining signal characteristics. For instance, the PIM test device 100 may automatically select the second frequency or second power level in response to receiving the first frequency or first power level, respectively, from the user via the input device 125.

At block 310, the PIM test device 100 may receive a selection of the order product. In one exemplary approach, the technician may designate which intermodulation order product, such as the third order product, fifth order product, or seventh order product, for which to test. The PIM test device 100 may prompt the technician to select the desired order product via the display device 120, and the PIM test device 100 may receive the technician's selection via the input device 125.

At block 315, the PIM test device 100 may conduct a return loss pre-test. Return loss may be defined as a loss of signal power resulting from a reflection caused by a transmission medium. The PIM test device 100 may be configured to test for return loss prior to testing for intermodulation to, e.g., eliminate return loss as a potential cause of interference.

At decision block 320, the PIM test device 100 may determine whether the return loss pre-test was passed. If so, meaning that return loss is not a significant cause of interference, the process 300 may continue at block 325. In one exemplary approach, the PIM test device 100 may return the results of the return loss pre-test via the display device 120 and, if passed, may prompt the technician to select whether to proceed with the non-intrusive intermodulation test. If return loss is determined to be a significant cause of interference, which may indicate to the technician that no intermodulation testing is needed or appropriate until return loss is reduced, or if the technician decides not to proceed with the non-intrusive test for any other reason, the process 300 may end.

At block 325, the PIM test device 100 may generate the first and second signals. As discussed above, the first and second signals may be generated via the first signal generator 205 and the second signal generator 210, respectively. The first and second signals may embody the signal characteristics, such as frequency, power level, etc., received at block 305. Moreover, the first and second signals may be generated in accordance with the desired order product selected at block 310.

At block 330, the PIM test device 100 may combine the first and second signals and transmit the combined signal to the device under test 200. For instance, the first combiner 220 may mix the first and second signals and provide the combined signal to the transmit port 105 so that the combined signal may be transmitted to the device under test 200. The first combiner 220 may generate and output the combined signal on the first frequency and the second frequency.

At block 335, the PIM test device 100 may receive the test signal from the device under test 200 via, e.g., the receive port 110. If the device under test 200 is producing intermodulation, it will be apparent from the test signal. That is, differences between the test signal and the combined signal may be due to intermodulation. This is especially true if the test signal includes frequencies at the third order product, the fifth order product, or the seventh order product of the first and second signals. In other words, the test signal may include the first frequency and the second frequency as well as frequencies caused by the third order product, the fifth order product, and the seventh order product.

At block 340, the PIM test device 100 may filter the received test signal to generate the intermodulation signal. The first duplexer 230 may, in one possible approach, receive the test signal from the receive port 110 and remove frequencies of the first signal and the second signal to produce the intermodulation signal. As mentioned above, the intermodulation signal may include the third order product, the fifth order product, and/or the seventh order product, among others.

At block 345, the PIM test device 100 may determine the sensitivity of the first receiver 255. The sensitivity may define a minimum power level required for the first receiver 255 to process the intermodulation signal. In one possible approach, the first receiver 255 may communicate the sensitivity to, e.g., the variable low-noise amplifier 245. The sensitivity of the first receiver 255 may alternatively be received from the technician via, e.g., the input device 125 in response to a prompt on the display device 120 or the sensitivity may be stored in a memory device (not shown) in the PIM test device 100 and automatically retrieved and used during subsequent testing.

At block 350, the PIM test device 100 may amplify the intermodulation signal based at least in part on the sensitivity of the first receiver 255. For instance, the sensitivity may be used to select the gain of a particular stage, and thus overall gain, of the variable low-noise amplifier 245. One stage may apply a particular gain that boosts the intermodulation signal to a particular power level, and another stage may follow to apply an additional gain to the already-boosted intermodulation signal.

At block 355, the PIM test device 100 may measure intermodulation generated by the device under test 200. For example, the amplified intermodulation signal may be provided to the first receiver 255 for processing. The first receiver 255 may identify frequencies at the third order product, the fifth order product, and/or the seventh order product in the amplified intermodulation signal to determine whether the device under test 200 is causing appreciable intermodulation and, if so, the amount of intermodulation.

At block 360, the PIM test device 100 may display the measured intermodulation on the display device 120. In one possible implementation, the first receiver 255 may cause the display device 120 to present a visual representation of the measured intermodulation to the technician. One possible visual representation may include a signal diagram and/or numerical representation at the intermodulation frequencies. The PIM test device 100 may further allow the technician to save the results of the test to a memory device, such as an SD card using the card slot 135. That is, the PIM test device 100 may prompt the technician to select whether to save the results of the test to the memory device. If the technician elects to do so, the PIM test device 100 may transfer information onto the memory device for later processing by the first receiver 255 and viewing by the technician.

The process 300 may end after block 360. Alternatively, one or more blocks of the process 300 may be revisited to, e.g., perform multiple tests. The intermodulation measured at, e.g., block 355, may therefore be based on cumulative or averaged test results as opposed to the results of a single test.

Figure 4:
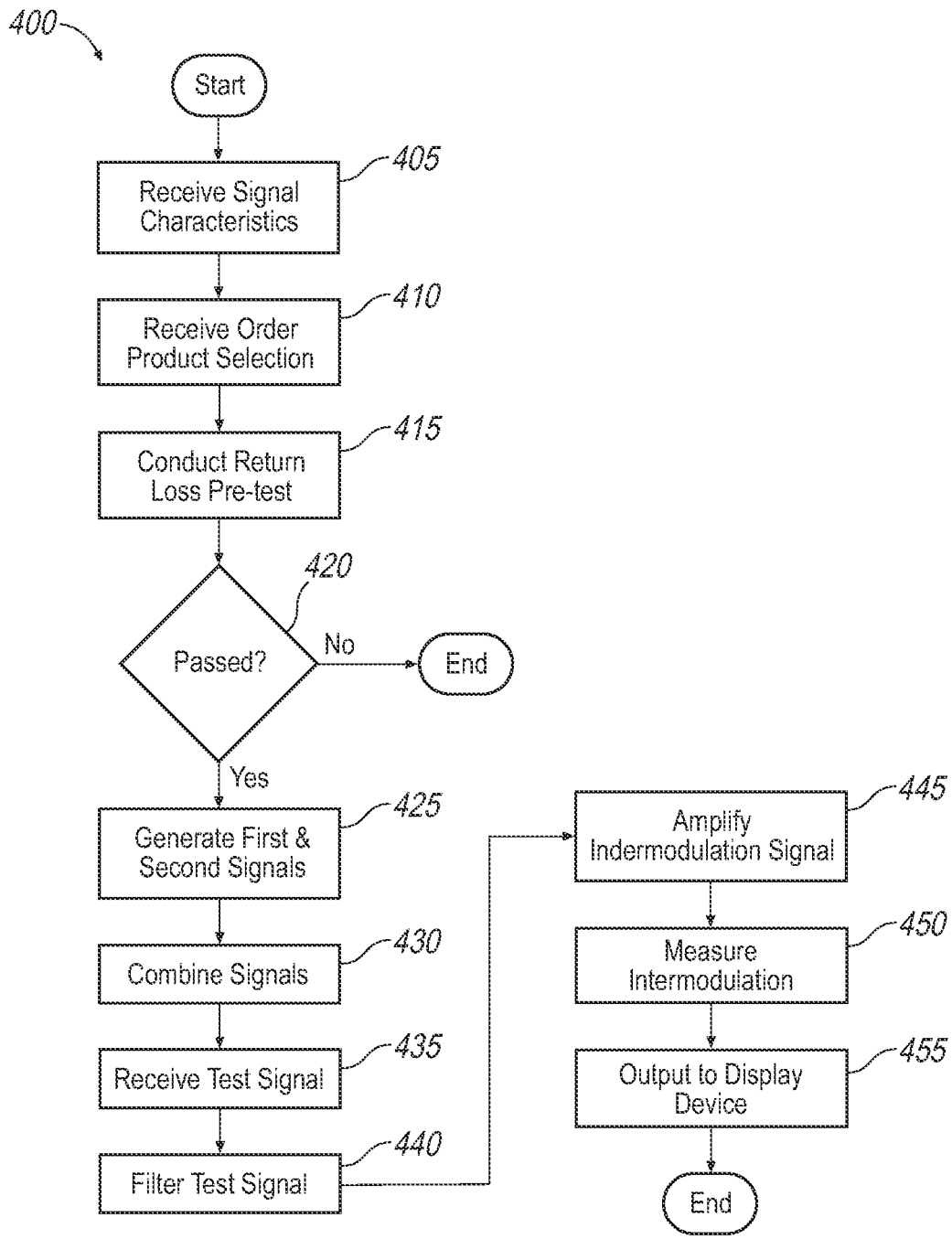
FIG. 4 is a flowchart of an exemplary process that may be implemented by the passive intermodulation test device to conduct an intrusive intermodulation test.

FIG. 4 illustrates an exemplary process 400 that may be implemented by the PIM test device 100 to conduct an intrusive test for passive intermodulation.

At block 405, the PIM test device 100 may receive signal characteristics for the signals used in the intrusive test. In one exemplary approach, the PIM test device 100, using the display device 120, may prompt the user to provide any one or more of the first frequency and the first power level for the first signal and the second frequency and second power level for the second signal. The PIM test device 100 may receive the signal characteristics from the user via the input device 125. In some embodiments, the PIM test device 100 may use one or more received signal characteristics to determine one or more remaining signal characteristics. For instance, the PIM test device 100 may select the second frequency or second power level in response to receiving the first frequency or first power level, respectively, from the user via the input device 125.

At block 410, the PIM test device 100 may receive a selection of the order product. In one exemplary approach, the technician may designate which intermodulation order product, such as the third order product, fifth order product, or seventh order product, to test. The PIM test device 100 may prompt the technician to select the desired order product via the display device 120, and the PIM test device 100 may receive the technician's selection via the input device 125.

At block 415, the PIM test device 100 may conduct a return loss pre-test. Return loss may be defined as a loss of signal power resulting from a reflection caused by a transmission medium. The PIM test device 100 may be configured to test for return loss prior to testing for intermodulation to, e.g., eliminate return loss as a potential cause of interference.

At decision block 420, the PIM test device 100 may determine whether the return loss pre-test was passed. If so, meaning that return loss is not a significant cause of interference, the process 400 may continue at block 425. In one exemplary approach, the PIM test device 100 may prompt the technician to select whether to proceed with the intrusive intermodulation test. If return loss is determined to be a significant cause of interference or if the technician decides not to proceed with the intrusive test, the process 400 may end.

At block 425, the PIM test device 100 may generate the first and second signals. As discussed above, the first and second signals may be generated via the first signal generator 205 and the second signal generator 210, respectively. The first and second signals may embody the signal characteristics, such as frequency, power level, etc., received at block 405. Moreover, the first and second signals may be generated in accordance with the desired order product selected at block 410.

At block 430, the PIM test device 100 may combine the first and second signals and transmit the combined signal to the device under test 200. For instance, the second combiner 225 may mix the first and second signals and provide the combined signal to the second duplexer 235, which in turn may output the combined signal to the device under test 200 via the transmit/receive port 115. The second combiner 225 may generate and output the combined signal with a generally equal distribution of power on the first frequency and the second frequency.

At block 435, the PIM test device 100 may receive the test signal from the device under test 200 via, e.g., the transmit/receive port 115. If the device under test 200 is producing intermodulation, it will be apparent from the test signal. That is, differences between the test signal and the combined signal may be due to intermodulation. This is especially true if the test signal includes frequencies at the third order product, the fifth order product, or the seventh order product of the first and second signals. In other words, the test signal may include the first frequency and the second frequency as well as frequencies caused by the third order product, the fifth order product, and the seventh order product.

At block 440, the PIM test device 100 may filter the test signal to generate the intermodulation signal. The second duplexer 235 may, in one possible approach, receive the test signal from the transmit/receive port 115 and remove the first signal and the second signal to produce the intermodulation signal. Also, because the transmit/receive port 115 is configured to facilitate duplexed communication, the second duplexer 235 may remove additional signal components to further isolate the intermodulation signal from the test signal. As mentioned above, the intermodulation signal may include the third order product, the fifth order product, or the seventh order product.

At block 445, the PIM test device 100 may amplify and filter the intermodulation signal isolated from the test signal. For instance, a noise filter 240 may be used to reduce noise in the intermodulation signal, and the low-noise amplifier 250 may apply a predetermined gain to the intermodulation signal, resulting in an amplified intermodulation signal.

At block 450, the PIM test device 100 may measure intermodulation generated by the device under test 200. For example, the intermodulation signal may be provided to the second receiver 260 for processing after being amplified at block 445. The second receiver 260 may identify frequencies at the third order product, the fifth order product, and the seventh order product in the intermodulation signal to determine whether the device under test 200 is causing intermodulation.

At block 455, the PIM test device 100 may display the measured intermodulation on the display device 120. In one possible implementation, the second receiver 260 may cause the display device 120 to present a visual representation of the intrusively-measured intermodulation to the technician. The PIM test device 100 may further allow the technician to save the results of the test to a memory device, such as an SD card using the card slot 135. That is, the PIM test device 100 may prompt the technician to select whether to save the results of the test to the memory device. If the technician elects to do so, the PIM test device 100 may transfer information onto the memory device for later processing by the second receiver 260 and viewing by the technician.

Figure 5:
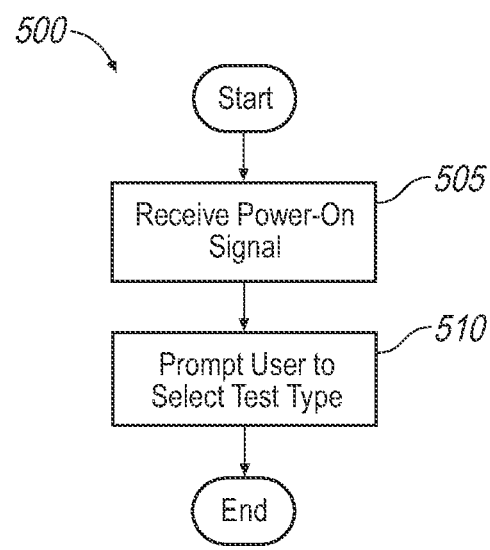
FIG. 5 is a flowchart of an exemplary process that may be implemented by the passive intermodulation test to allow for both intrusive and non-intrusive tests to be performed.

The process 400 may end after block 455. In the alternative, some portions of the process 400 may be repeated to, e.g., collect multiple intermodulation test results prior to ending the process 400. The intermodulation measured at, e.g., block 450, may therefore be based on cumulative or averaged test results as opposed to the results of a single test FIG. 5 illustrates another example process 500 that may be implemented by the PIM test device 100. As discussed above, the PIM test device 100 may be configured to conduct both intrusive and non-intrusive tests.

At block 505, the PIM test device 100 may receive a power-on signal. For instance, the power-on signal may be generated in response to the technician pressing the power button 145 on the PIM test device 100.

At block 510, the PIM test device 100 may prompt the technician to select either an intrusive test or a non-intrusive test. If the technician selects the intrusive test, the process 500 may continue with the process 400 illustrated in FIG. 4. If the technician selects the non-intrusive test, the process 500 may continue with the process 300 illustrated in FIG. 3. In one exemplary approach, the PIM test device 100 may recommend conducting the intrusive test prior to the non-intrusive test. Moreover, the PIM test device 100 may recommend conducting the intrusive test if the device under test 200 is configured for duplexed communication.

FIG. 6A illustrates exemplary test points of an intrusive passive intermodulation test. As illustrated, multiple antennas 600A-D, collectively 600, are in communication with a base station 605 that houses various components, some configured for duplexed communication and other configured for unduplexed communication. The intrusive passive intermodulation test may occur at a test point 610 somewhere along a signal path between the base station and one or more of the antennas. One or more connectors 615A-D, collectively 615, may allow the PIM test device 100 to connect to the signal path 610. A separate connector 615 may be used for each antenna 600 connected to the base station 605.

FIG. 6B illustrates exemplary test points for a non-intrusive passive intermodulation test. As illustrated, the test point for the non-intrusive passive intermodulation test may be within the base station 605 as opposed to between the base station 605 and one or more antennas 600. The base station 605 shown in FIG. 6B includes a transmit/receive connector 620 configured to transmit and receive signals along the signal path to the antennas 600. The base station 605 further may further include one or more transmit connectors 625 and one or more receive connectors 630, which may be configured to connect to the transmit port 105 and the receive port 110, respectively, of the PIM test device 100. The base station 605 may include any number of transmit connectors 625 and receive connectors 620. For instance, each component in the base station 605 that may cause intermodulation may include one or both of a transmit connector 625 and a receive connector 630. Once the PIM test device 100 is connected to one or both connectors 625, 630, the PIM test device 100 may non-invasively test for passive intermodulation.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A passive intermodulation test device comprising:
a first signal generator configured to generate a first signal;
a second signal generator configured to generate a second signal;
a first combiner configured to combine the first signal and the second signal to generate a combined signal, and to provide the combined signal directly to an unduplexed device under test;
a second combiner configured to combine the first signal and the second signal to generate a combined signal;
a first duplexer configured to receive a test signal from the unduplexed device under test based at least in part on the combined signal from the first combiner, and wherein the first duplexer is configured to filter the first signal and the second signal from the test signal to generate an intermodulation signal;
a second duplexer configured to receive the combined signal from the second combiner, and to transmit the combined signal to a duplexed device under test;
a variable low-noise amplifier in communication with the first duplexer and configured to amplify the intermodulation signal in accordance with a variable gain based at least in part on a selected power level; and
a receiver in communication with the variable low-noise amplifier and configured to receive the intermodulation signal and measure intermodulation generated by the unduplexed device under test.

2. A device as set forth in claim 1, wherein the first signal generator is configured to generate the first signal having a first frequency, the second signal generator is configured to generate the second signal having a second frequency, and the first frequency is different from the second frequency.

3. A device as set forth in claim 1, further comprising a plurality of power amplifiers, wherein a first power amplifier is configured to amplify the first signal to a first power level and a second power amplifier is configured to amplify the second signal to a second power level.

4. A device as set forth in claim 3, wherein the first power level is different from the second power level.

5. A device as set forth in claim 1, further comprising:
a transmit port configured to interface with the unduplexed device under test, and wherein the first combiner is configured to output the combined signal to the unduplexed device under test via the transmit port; and
a receive port configured to interface with the unduplexed device under test, and wherein the first duplexer is configured to receive the test signal from the unduplexed device under test via the receive port.

6. A device as set forth in claim 1, wherein the variable low-noise amplifier is configured to adjust the variable gain based at least in part on a sensitivity of the receiver.

7. A device as set forth in claim 1, further comprising a transmit/receive port configured to interface with the duplexed device under test.

8. A device as set forth in claim 7, further comprising a low-noise amplifier configured to receive signals from the duplexed device under test via the second duplexer.

9. A method comprising:
generating a first signal;
generating the second signal;
combining, by a first combiner, the first signal with the second signal to produce a combined signal;
transmitting the combined signal from the first combiner directly to an unduplexed device under test;
receiving, by a first duplexer, a test signal from the unduplexed device under test, wherein the test signal is based at least in part on the first signal and the second signal;
filtering the test signal to generate an intermodulation signal;
determining a sensitivity of a receiver;
adjusting a variable gain of a variable low-noise amplifier based at least in part on the sensitivity of the receiver;
measuring intermodulation generated by the unduplexed device under test based at least in part on the intermodulation signal;
combining, by a second combiner, the first signal and the second signal to produce a combined signal; and
transmitting the combined signal from the second combiner to a duplexed device under test via a second duplexer.

10. A method as set forth in claim 9, further comprising:
receiving a selection of a first power level, wherein generating the first signal is based at least in part on the first power level; and
receiving a selection of a second power level, wherein generating the second signal is based at least in part on the second power level.

11. A method as set forth in claim 9, wherein filtering the test signal includes filtering the first signal and the second signal from the test signal.

12. A method as set forth in claim 9, further comprising displaying the measured intermodulation on a display device.

13. A method as set forth in claim 9, further comprising receiving a selection of at least one of a first frequency and a second frequency.

14. A method as set forth in claim 13, wherein generating the first signal is based at least in part on the first frequency and wherein generating the second signal is based at least in part on the second frequency.

15. A method as set forth in claim 9, further comprising performing a return loss pre-test prior to measuring the intermodulation generated by the unduplexed device under test.

16. A method as set forth in claim 9, further comprising prompting a user to select at least one of a non-intrusive test and an intrusive test.

17. A non-transitory computer-readable medium tangibly embodying computer-executable instructions that when executed by a processor cause the processor to perform functions, the functions comprising:
transmitting a combined signal from a first combiner directly to an unduplexed device under test;
receiving, by a first duplexer, a test signal from the unduplexed device under test;
generating an intermodulation signal from the test signal received from the unduplexed device under test;
filtering the test signal to generate an intermodulation signal;

amplifying the intermodulation signal in accordance with a variable gain based at least in part on a selected power level;

measuring intermodulation generated by the device under test based at least in part on the intermodulation signal as amplified; and transmitting a combined signal from a second combiner to a duplexed device under test via a second duplexer.

18. A non-transitory computer-readable medium as set forth in claim 17, further comprising generating the combined signal by combining a first signal having a first frequency and a first power level with a second signal having a second frequency and a second power level.

19. A non-transitory computer-readable medium as set forth in claim 18, wherein the first frequency is different from the second frequency and wherein the first power level is different from the second power level.

20. A non-transitory computer-readable medium as set forth in claim 17, further comprising adjusting the variable gain based at least in part on a sensitivity of a receiver.

21. A non-transitory computer-readable medium as set forth in claim 17, further comprising receiving a selection of at least one of an intrusive test and a non-intrusive test.

* * * * *